(12) United States Patent
Frougier et al.

(10) Patent No.: US 10,770,566 B2
(45) Date of Patent: Sep. 8, 2020

(54) UNIQUE GATE CAP AND GATE CAP SPACER STRUCTURES FOR DEVICES ON INTEGRATED CIRCUIT PRODUCTS

(71) Applicant: GLOBALFOUNDRIES Inc., Grand Cayman (KY)

(72) Inventors: Julien Frougier, Albany, NY (US); Ruilong Xie, Niskayuna, NY (US); Chanro Park, Clifton Park, NY (US); Kangguo Cheng, Schenectady, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/594,276

(22) Filed: Oct. 7, 2019

(65) Prior Publication Data

US 2020/0052088 A1   Feb. 13, 2020

Related U.S. Application Data

(63) Continuation of application No. 16/101,876, filed on Aug. 13, 2018, now Pat. No. 10,529,826.

(51) Int. Cl.
*H01L 29/66* (2006.01)
*H01L 21/764* (2006.01)
*H01L 21/768* (2006.01)
*H01L 29/417* (2006.01)
*H01L 29/423* (2006.01)

(52) U.S. Cl.
CPC ........ *H01L 29/6656* (2013.01); *H01L 21/764* (2013.01); *H01L 21/76897* (2013.01); *H01L 29/41725* (2013.01); *H01L 29/41766* (2013.01); *H01L 29/41775* (2013.01); *H01L 29/4236* (2013.01); *H01L 29/42372* (2013.01); *H01L 29/6653* (2013.01); *H01L 29/66553* (2013.01); *H01L 29/66613* (2013.01)

(58) Field of Classification Search
CPC .......... H01L 29/66553; H01L 29/6656; H01L 21/823468; H01L 29/66689; H01L 29/66719; H01L 29/42356; H01L 29/4236; H01L 29/41766; H01L 29/41755
See application file for complete search history.

(56) References Cited

U.S. PATENT DOCUMENTS

| 5,869,379 A | 2/1999 | Gardner et al. |
| 6,238,987 B1 | 5/2001 | Lee |
| 7,741,663 B2 | 6/2010 | Hause et al. |
| 8,421,166 B2 | 4/2013 | Chi et al. |

(Continued)

OTHER PUBLICATIONS

Examination Report from Taiwanese Patent Application No. 108124703 dated May 4, 2020.

*Primary Examiner* — Scott B Geyer
(74) *Attorney, Agent, or Firm* — Amerson Law Firm, PLLC

(57) ABSTRACT

A device is disclosed that includes an active layer, a gate structure positioned above a channel region of the active layer and a first sidewall spacer positioned adjacent the gate structure. The device also includes a gate cap layer positioned above the gate structure and an upper spacer that contacts sidewall surfaces of the gate cap layer, a portion of an upper surface of the gate structure and an inner surface of the first sidewall spacer.

20 Claims, 5 Drawing Sheets

(56) References Cited

U.S. PATENT DOCUMENTS

| | | |
|---|---|---|
| 8,916,438 B2 * | 12/2014 | Lin .................. H01L 21/02233 |
| | | 438/270 |
| 9,431,507 B2 | 8/2016 | Xie et al. |
| 9,735,246 B1 | 8/2017 | Basker et al. |
| 9,786,784 B1 | 10/2017 | Song et al. |
| 10,388,747 B1 | 8/2019 | Xie et al. |
| 2002/0115257 A1 * | 8/2002 | Inagawa ............. H01L 29/7821 |
| | | 438/270 |
| 2007/0104862 A1 | 5/2007 | Lai |
| 2007/0155074 A1 | 7/2007 | Ho et al. |
| 2008/0035989 A1 * | 2/2008 | Jaw .................. H01L 29/66734 |
| | | 257/330 |
| 2010/0052029 A1 | 3/2010 | Huang |
| 2013/0181284 A1 * | 7/2013 | Poelzl .................. H01L 29/401 |
| | | 257/332 |
| 2015/0214220 A1 | 7/2015 | Seo et al. |
| 2015/0243544 A1 | 8/2015 | Alptekin et al. |
| 2015/0243773 A1 * | 8/2015 | Basu .................. H01L 29/778 |
| | | 257/194 |
| 2015/0333136 A1 | 11/2015 | Xie et al. |
| 2017/0054004 A1 | 2/2017 | Cheng et al. |
| 2017/0125284 A1 | 5/2017 | Cheng et al. |
| 2017/0194423 A1 | 7/2017 | Lin |
| 2017/0250180 A1 | 8/2017 | Lee |
| 2018/0033863 A1 | 2/2018 | Xie et al. |
| 2018/0138279 A1 | 5/2018 | Xie et al. |
| 2018/0350932 A1 | 12/2018 | Liu et al. |
| 2019/0006484 A1 | 1/2019 | Wu et al. |
| 2019/0123175 A1 | 4/2019 | Hsu et al. |
| 2019/0165121 A1 | 5/2019 | Park |

* cited by examiner

UNIQUE GATE CAP AND GATE CAP SPACER STRUCTURES FOR DEVICES ON INTEGRATED CIRCUIT PRODUCTS

BACKGROUND

1. Field of the Disclosure

The present disclosure generally relates to the fabrication of semiconductor devices, and, more particularly, to unique gate cap and gate cap spacer structures for devices on integrated circuit products.

2. Description of the Related Art

Typically, due to the large number of semiconductor devices (i.e., circuit elements such as transistors, resistors, capacitors, etc.) and the required complex layout of modern integrated circuits, the electrical connections or "wiring arrangement" for the individual semiconductor devices, e.g., transistors, capacitors, etc., cannot be established within the same device level on which the semiconductor devices are manufactured. Accordingly, the various electrical connections that constitute the overall wiring pattern for the IC product are formed in a metallization system that comprises a plurality of stacked "metallization layers" that are formed above the device level of the product.

In order to function properly, for a typical transistor, separate conductive electrical paths are formed for the conductive gate structure, the source region and the drain region of the transistor. Part of that process involves forming what are generally referred to as device level contacts, i.e., a plurality of so-called "CA contact" structures for establishing electrical connection to the source/drain regions of the transistor device, and a gate contact structure, which is sometimes referred to as a "CB contact" structure, for establishing electrical connection to the gate structure of the transistor device. The CB gate contact is typically positioned vertically above isolation material that surrounds the transistor device, i.e., the CB gate contact is typically not positioned above the active region, but it may be in some advanced architectures.

The CB gate contact is typically positioned above the isolation region so as to avoid or reduce the chances of creating an electrical short between the CB gate contact and the conductive source/drain structures (e.g., trench silicide (TS) structures) formed in the source/drain regions of the transistor adjacent the gate structure of the transistor. Typically, there are also design rules that set a minimum spacing that must be maintained between the CB gate contact and the conductive source/drain structures in an attempt to prevent such electrical shorts. Unfortunately, there is an area penalty associated with the requirement that the CB gate contact only be positioned above the isolation region. Additionally, insulating material, typically in the form of at least a sidewall spacer, is positioned between the gate structure and the conductive source/drain structures located on opposite sides of the gate structure. The spacer is typically made of silicon nitride which has a relatively high k value of, e.g., about 7-8. As a result of the physical configuration of the transistor, a gate-to-contact capacitor is defined, wherein the gate electrode functions as one of the conductive plates of the capacitor, the conductive source/drain structures function as the other conductive plate of the capacitor and the spacer is positioned between the two conductive plates. This gate-to-contact capacitor is parasitic in nature in that this capacitor must charge and discharge every time the transistor device is turned on and off, all of which results in delaying the switching speed of the device.

The present disclosure is directed to various methods and resulting devices that may avoid, or at least reduce, the effects of one or more of the problems identified above.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to unique gate cap and gate cap spacer structures for devices on integrated circuit products. One illustrative device includes, among other things, an active layer, a gate structure positioned above a channel region of the active layer and a first sidewall spacer positioned adjacent the gate structure. The device also includes a gate cap layer positioned above the gate structure and an upper spacer that contacts sidewall surfaces of the gate cap layer, a portion of an upper surface of the gate structure and an inner surface of the first sidewall spacer.

Another illustrative device includes, among other things, an active layer, a gate structure positioned above a channel region of the active layer, the gate structure comprising a first width in a direction corresponding to a gate length direction of the device, and a first sidewall spacer positioned adjacent the gate structure. The device also includes a gate cap layer positioned above the gate structure, the gate cap layer comprising a second width in a direction corresponding to the gate length direction of the device, wherein the second width is less than the first width, and an upper spacer contacting sidewall surfaces of the gate cap layer, a portion of an upper surface of the gate structure and a portion of the first sidewall spacer.

Another illustrative device includes, among other things, an active layer, a gate structure positioned above a channel region of the active layer, the gate structure comprising a first width in a direction corresponding to a gate length direction of the device, and a first sidewall spacer positioned adjacent the gate structure. The device also includes a gate cap layer positioned above the gate structure, the gate cap layer comprising a second width in a direction corresponding to the gate length direction of the device, wherein the second width is less than the first width, and an upper spacer contacting sidewall surfaces of the gate cap layer, a portion of an upper surface of the gate structure and an inner surface of the first sidewall spacer.

BRIEF DESCRIPTION OF THE DRAWINGS

The disclosure may be understood by reference to the following description taken in conjunction with the accompanying drawings, in which like reference numerals identify like elements, and in which.

Figure 1A:
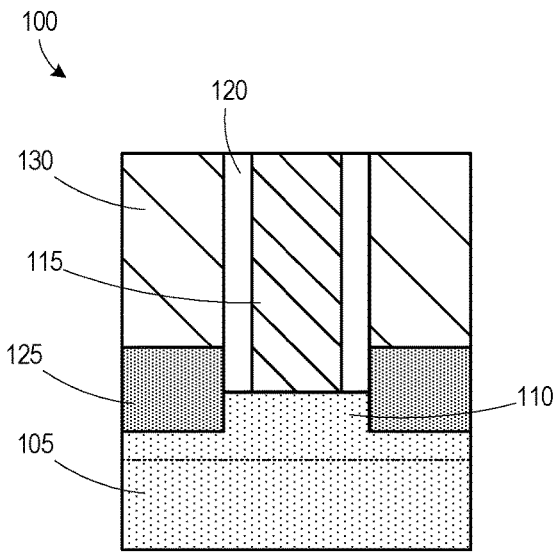
FIGS. 1A-1J depict various methods disclosed herein for forming self-aligned gate and source/drain contacts using a sacrificial gate cap spacer and the resulting devices.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming self-aligned gate and source/drain contacts using a sacrificial gate cap spacer and the resulting devices. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

FIGS. 1A-1J illustrate various methods for forming self-aligned gate and source/drain contacts using a sacrificial gate cap spacer in a semiconductor device 100. In the illustrated embodiment, the contacts are formed for a finFET device, however, the application of the techniques are not limited to a particular type of device, and they may be applied to other structures, such as planar transistors, gate-all-around (GAA) nanowire transistors, GAA nanosheet transistors, etc., built on bulk, SOI, or hybrid substrates FIGS. 1A-1G and 1I-1J show a cross-sectional view (in the gate length direction of the device 100, i.e., in the direction of current flow when the device is operational) of a substrate 105 with a fin 110 defined therein (as delineated by a dashed line). A gate structure 115, including a gate insulation layer (e.g., high-k material, such as hafnium dioxide) and a metal gate electrode (e.g., containing one or more layers, such as a barrier layer, work function material layer, seed layer, conductive fill layer, etc.)—not separately shown, is formed above a channel region of the fin 110. A first sidewall spacer 120 (e.g., SiN, SiOC, etc.) is formed adjacent the gate structure 115. Source/drain regions 125 (e.g., epitaxially grown semiconductor material, such as silicon germanium, silicon carbon, silicon, silicon phosphorous, etc., depending on the particular transistor device type) are formed in trenches defined in the fin 110 adjacent the gate structure 115 and the sidewall spacer 120. A dielectric layer 130 (e.g., silicon dioxide, low-k dielectric material, ultra-low-k dielectric material, etc.) is formed adjacent the first sidewall spacer 120.

The finFET device 100 depicted herein may be either an NMOS or a PMOS transistor. Additionally, various doped regions, e.g., halo implant regions, well regions and the like, may be formed in the substrate 105, the fin 110 or the source/drain regions 125, but these doped regions are not depicted in the attached drawings. The substrate 105 may have a variety of configurations, such as the depicted bulk silicon configuration. The substrate 105 may also have a silicon-on-insulator (SOI) configuration that includes a bulk silicon layer, a buried insulation layer and an active layer, wherein semiconductor devices are formed in and above the active layer. The substrate 105 and/or the fin 110 may be formed of silicon or silicon germanium or it may be made of materials other than silicon, such as germanium. Thus, the terms "substrate" or "semiconductor substrate" should be understood to cover all semiconducting materials and all forms of such materials. The substrate 105 may have different layers. For example, the fins 110 may be formed in a process layer formed above the base layer of the substrate 105.

Figure 1B:
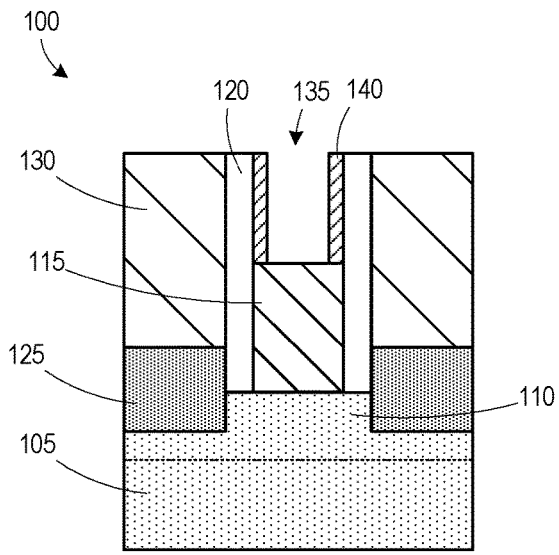

FIG. 1B illustrates the device 100 after an etch process was performed to recess the gate structure 115 to define a cap cavity 135 and several processes were performed to form an inner spacer 140 (e.g., amorphous silicon) on sidewalls of the cap cavity 135. A conformal deposition process was performed to define a spacer layer in the cap cavity 135 and above the dielectric layer 130 and an anisotropic etch process was performed to remove horizontal portions of the spacer layer, thereby defining the inner spacer 140.

Figure 1C:
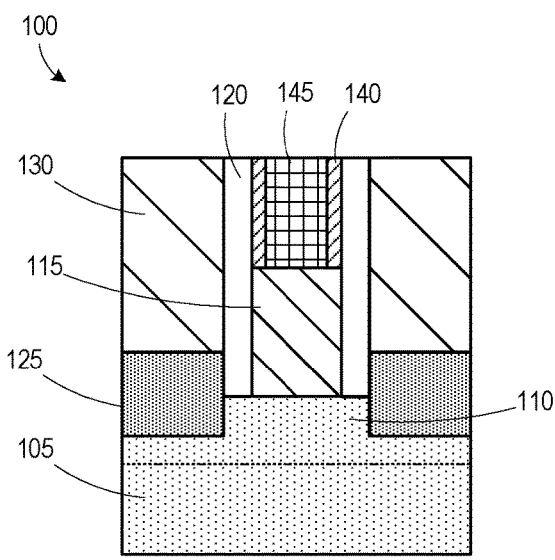

FIG. 1C illustrates the device 100 after a deposition process was performed to form a cap layer 145 (e.g., silicon nitride) in the cap cavity 135 and a planarization process was performed to remove portions of the cap layer 145 outside the cap cavity 135.

Figure 1D:
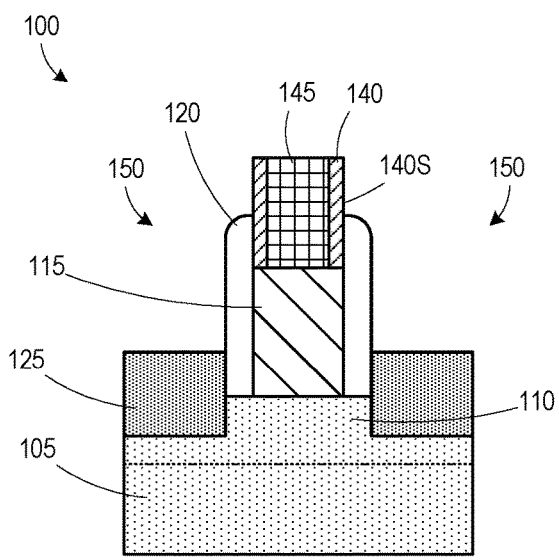

FIG. 1D illustrates the device 100 after one or more etch processes were performed to recess the dielectric layer after 130 to define contact openings 150 adjacent the sidewall spacer 120, thereby exposing the source/drain regions 125. The one or more etch processes also reduce a height of the sidewall spacer 120, thereby exposing an outer sidewall surface 140S of the inner spacer 140. Although not visible in FIG. 1D, the contact openings 150 extend between adjacent gate structures 115 with sidewall spacers 120. For ease of illustration, the adjacent gate structures 115 are not shown. The one or more etch processes may include: an isotropic etch to selectively recess the dielectric layer 130 followed by a selective anisotropic etch to reduce the height of the sidewall spacer 120; a selective anisotropic etch to reduce the height of the sidewall spacer 120 followed by an isotropic etch to selectively recess the dielectric layer 130, providing protection to the source/drain regions 125; or an anisotropic etch timed to recess the dielectric layer 130 and reduce the height of the sidewall spacer 120.

Figure 1E:
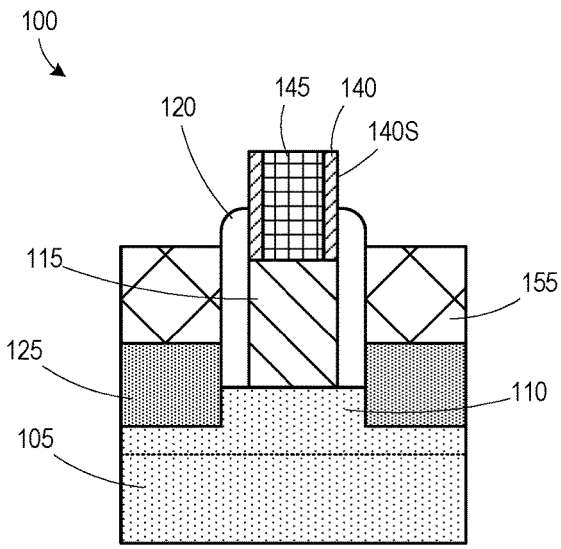

FIG. 1E illustrates the device 100 after lower source/drain contact structures 155 (e.g., trench silicide) are formed in the contact openings 150. The lower source/drain contact structures 155 may be formed by filling the contact openings 150 and performing an etch process to recess the lower source/drain contact structure 155.

Figure 1F:
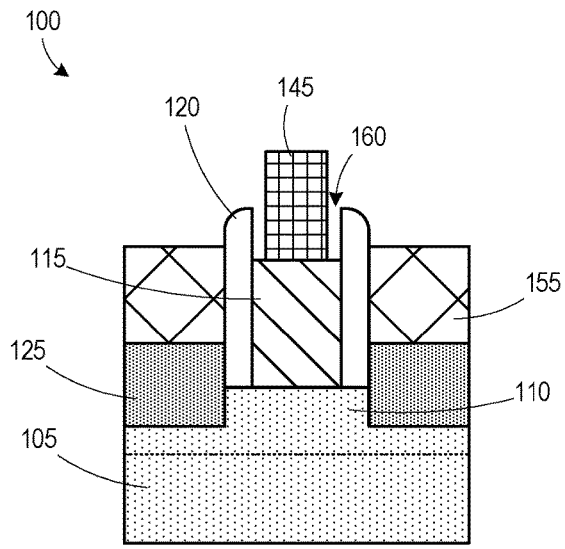

FIG. 1F illustrates the device 100 after a selective etch process was performed to remove the inner spacer 140, thereby creating a spacer cavity 160 between the sidewall spacer 120 and the cap layer 145.

Figure 1G:
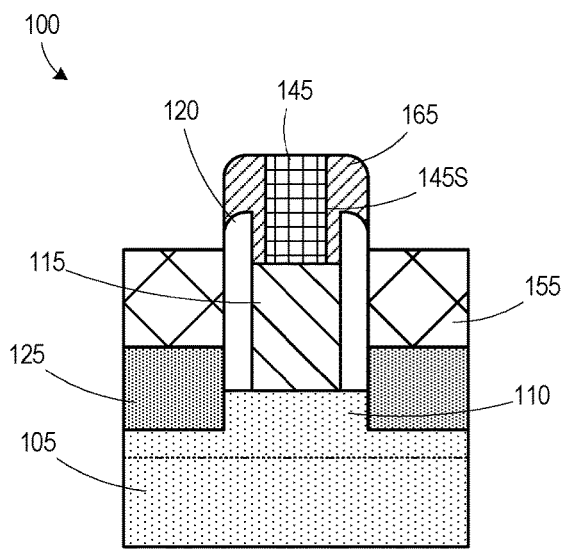

FIG. 1G illustrates the device 100 after several processes were performed to form an upper spacer 165 (e.g., SiOC or other material with etch selectivity to material of subsequent ILD dielectric layer and cap layer 145) above the sidewall spacer 120 and in the spacer cavity 160, thereby covering sidewall surfaces 145S of the cap layer 145. A conformal deposition process was performed to define a spacer layer in the spacer cavity 160 and above the sidewall spacer 120 and lower source/drain contact structures 155 and an anisotropic etch process was performed to remove portions of the spacer layer above the lower source/drain contact structures 155, thereby defining the upper spacer 165.

Figure 1H:
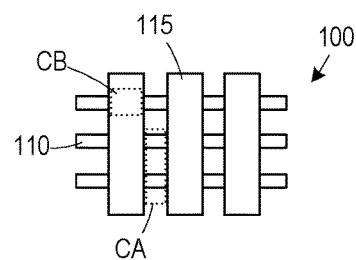

FIG. 1H illustrates a top view of the device 100 in simplified form, illustrating the fins 110 and the gate structures 115. A CA contact is to be formed contacting the source/drain regions 125, and a CB contact is to be formed contacting the gate structure 115. The location and number of CA and CB contacts may vary.

Figure 1I:
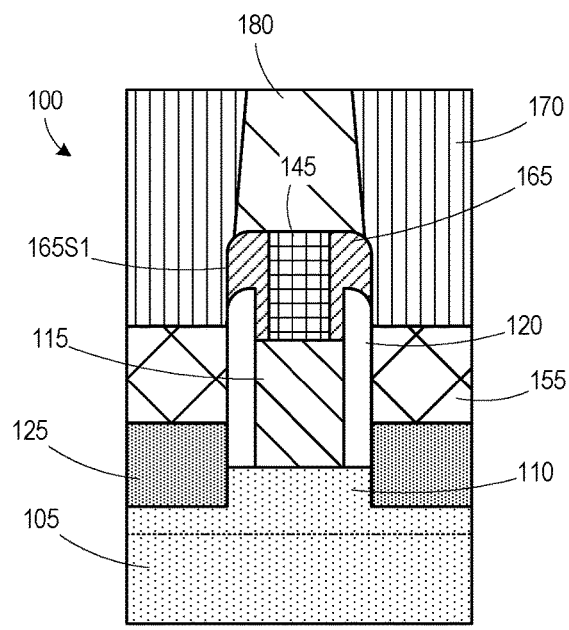
Figure 1J:
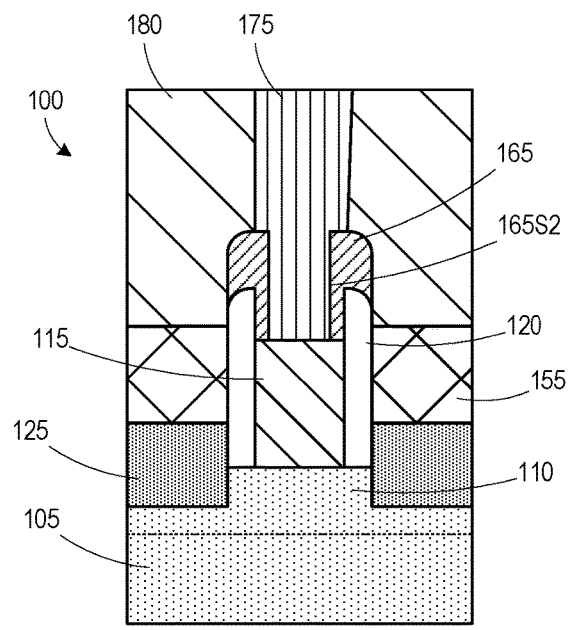

FIGS. 1I and 1J illustrate the device 100 after several processes were performed to form upper source/drain contact structures 170 (i.e., CA contacts) and gate contact structures 175 (i.e., CB contacts), respectively. A deposition process was performed to form a dielectric layer 180, and a patterning process (e.g., lithography and etch) was performed to define contact openings in the dielectric layer 180 to expose a portion of the lower source/drain contact structures 155 in a CA region and to expose a portion of the cap layer 145 in a CB region. A selective etch process was performed to remove exposed portions of the cap layer 145. One or more processes were performed to deposit conductive material (e.g., liner layer, barrier layer, seed layer, fill material (tungsten, cobalt), etc.) for the upper source/drain contact structures 170 and the gate contact structures 175. The contact openings for the upper source/drain contact structures 170 are self-aligned using the outer surface 165S1 of the upper spacers 165, and the gate contact structures 175 are self-aligned using the cap layer 145 and the inner surface 165S2 of the upper spacers 165.

Figure 2A:
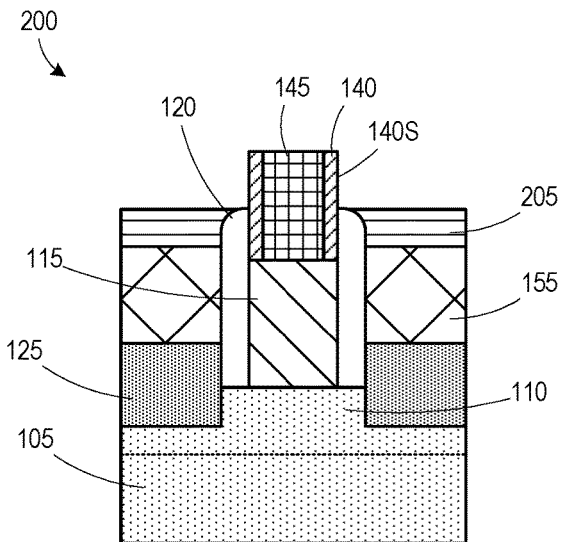
FIGS. 2A-2E depict various methods disclosed herein for forming self-aligned gate and source/drain contacts using a sacrificial gate cap spacer and the resulting devices.

FIGS. 2A-2E illustrate an alternative embodiment of a method for forming a device 200 employing air gap spacers. FIG. 2A illustrates the device 200 starting with the process stage shown for the device 100 in FIG. 1E after a deposition process was performed to form intermediate source/drain contact structures 205 (e.g., tungsten) above the lower source/drain contact structures 155. The material for the intermediate source/drain contact structures 205 may be deposited and an etch process may be performed to recess the material until top portions of the sidewall spacer 120 are exposed.

Figure 2B:
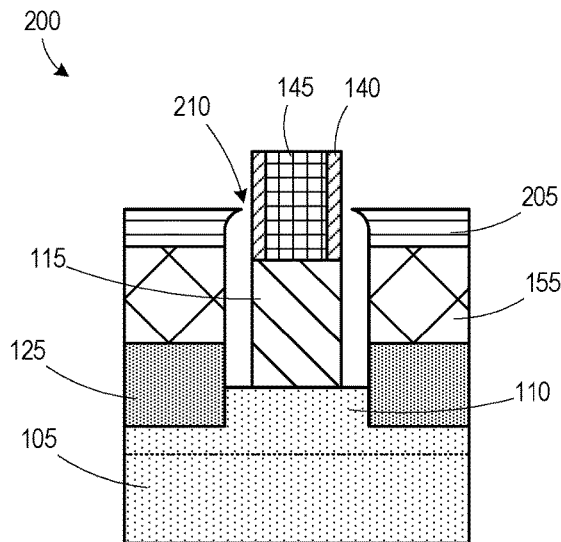

FIG. 2B illustrates the device 200 after a selective etch process was performed to remove the sidewall spacer 120 to define a lower spacer cavity 210.

Figure 2C:
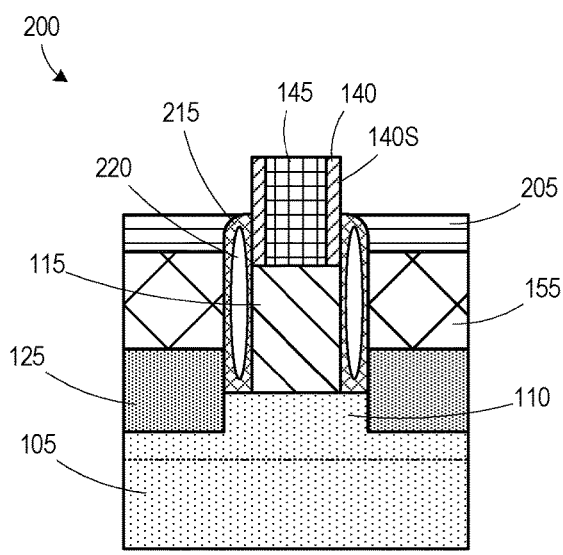

FIG. 2C illustrates the device 200 after a deposition process was performed to form a dielectric material 215 (e.g., SiBCN) to pinch off the lower spacer cavity 210, thereby defining air gaps 220. The dielectric material 215 may line lower portions of the lower spacer cavity 210, or it may only pinch off the upper boundary of the lower spacer cavity 210. The dielectric material 215 may be referred to as a sidewall spacer with an air gap defined therein.

Figure 2D:
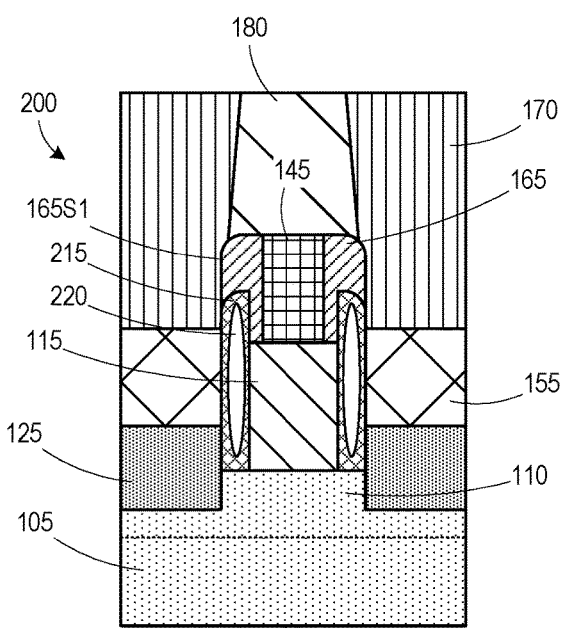
Figure 2E:
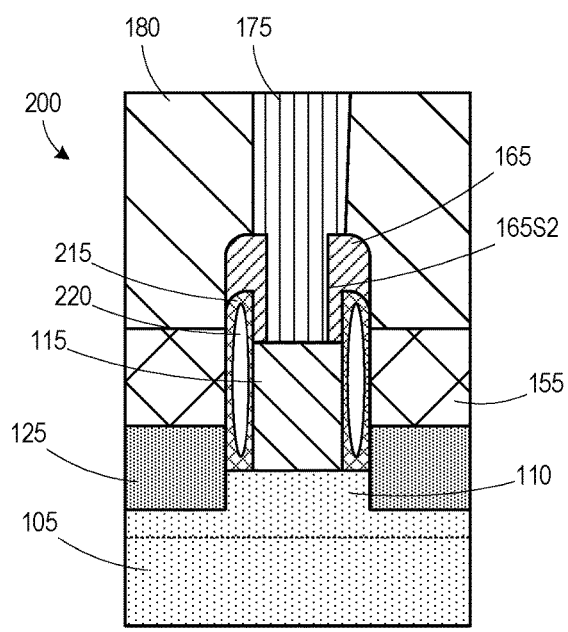

Processing of the device 200 may continue as described in FIGS. 1F-1J to form the upper source/drain contact structures 170 and the gate contact structures 175, as shown in FIGS. 2D and 2E.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A device, comprising:
   an active layer;
   a gate structure positioned above a channel region of the active layer;
   a first sidewall spacer positioned adjacent the gate structure;
   a gate cap layer positioned above the gate structure, the gate cap layer comprising an insulating material; and
   an upper spacer contacting sidewall surfaces of the gate cap layer, a portion of an upper surface of the gate structure and an inner surface of the first sidewall spacer.

2. The device of claim 1, wherein the gate cap layer has a first width in a direction corresponding to a gate length direction of the device, as measured at the upper surface of the gate structure, and the gate structure has a second width in the gate length direction, as measured at the upper surface of the gate structure, wherein the first width is less than the second width.

3. The device of claim 1, further comprising a gate contact structure that contacts an inner surface of the upper spacer and the upper surface of the gate structure.

4. The device of claim 1, wherein the first sidewall spacer comprises an air gap defined therein.

5. The device of claim 1, further comprising:
   a source/drain region positioned adjacent the first sidewall spacer;
   a lower source/drain contact structure contacting the source/drain region, and
   a source/drain contact structure that contacts the outer surface of the upper spacer and the lower source/drain contact structure.

6. The device of claim 1, wherein each of the first sidewall spacer, the gate cap layer and the upper spacer comprise different materials.

7. The device of claim 1, wherein the upper spacer contacts the sidewall surfaces of the gate cap layer.

8. A device, comprising:
an active layer;
a gate structure positioned above a channel region of the active layer, the gate structure having a first width in a direction corresponding to a gate length direction of the device, as measured at the upper surface of the gate structure;
a first sidewall spacer positioned adjacent the gate structure;
a gate cap layer positioned above the gate structure, the gate cap layer having a second width in a direction corresponding to the gate length direction of the device, as measured at the upper surface of the gate structure, wherein the second width is less than the first width; and
an upper spacer contacting sidewall surfaces of the gate cap layer, a portion of an upper surface of the gate structure and a portion of the first sidewall spacer.

9. The device of claim 8, further comprising a gate contact structure that contacts an inner surface of the upper spacer and the upper surface of the gate structure.

10. The device of claim 8, wherein the first sidewall spacer comprises an air gap defined therein.

11. The device of claim 8, further comprising:
a source/drain region positioned adjacent the first sidewall spacer;
a lower source/drain contact structure contacting the source/drain region, and
a source/drain contact structure that contacts the outer surface of the upper spacer and the lower source/drain contact structure.

12. The device of claim 8, wherein a portion of the upper spacer contacts a sidewall surface of the gate cap layer and an inner surface of the first sidewall spacer.

13. The device of claim 8, wherein each of the first sidewall spacer, the gate cap layer and the upper spacer comprise different materials.

14. A device, comprising:
an active layer;
a gate structure positioned above a channel region of the active layer, the gate structure having a first width in a direction corresponding to a gate length direction of the device, as measured at the upper surface of the gate structure;
a first sidewall spacer positioned adjacent the gate structure;
a gate cap layer positioned above the gate structure, the gate cap layer having a second width in a direction corresponding to the gate length direction of the device, as measured at the upper surface of the gate structure, wherein the second width is less than the first width; and
an upper spacer contacting sidewall surfaces of the gate cap layer, a portion of an upper surface of the gate structure and an inner surface of the first sidewall spacer.

15. The device of claim 14, further comprising a gate contact structure that contacts an inner surface of the upper spacer and the upper surface of the gate structure.

16. The device of claim 15, wherein each of the first sidewall spacer, the gate cap layer and the upper spacer comprise different materials.

17. The device of claim 14, wherein the first sidewall spacer comprises an air gap defined therein.

18. The device of claim 14, further comprising:
a source/drain region positioned adjacent the first sidewall spacer;
a lower source/drain contact structure contacting the source/drain region, and
a source/drain contact structure that contacts the outer surface of the upper spacer and the lower source/drain contact structure.

19. The device of claim 18, wherein each of the first sidewall spacer, the gate cap layer and the upper spacer comprise different materials.

20. The device of claim 14, wherein each of the first sidewall spacer, the gate cap layer and the upper spacer comprise different materials.

\* \* \* \* \*